(12) United States Patent
Kim

(10) Patent No.: US 7,755,440 B2
(45) Date of Patent: Jul. 13, 2010

(54) VOLTAGE CONTROLLED OSCILLATOR FOR CONTROLLING PHASE NOISE AND METHOD USING THE SAME

(75) Inventor: Woonyun Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 201 days.

(21) Appl. No.: 11/970,643

(22) Filed: Jan. 8, 2008

(65) Prior Publication Data
US 2008/0164954 A1   Jul. 10, 2008

(30) Foreign Application Priority Data
Jan. 8, 2007   (KR) .................. 10-2007-0002174

(51) Int. Cl.
*H03K 3/282* (2006.01)
(52) U.S. Cl. .................. 331/117 R; 331/117 FE; 331/167; 331/177 V
(58) Field of Classification Search ........... 331/109, 331/117 V, 117 FE, 167, 177 V, 177 R, 182, 331/183, 186
See application file for complete search history.

(56) References Cited

U.S. PATENT DOCUMENTS

| | | | |
|---|---|---|---|
| 6,552,620 B2 | 4/2003 | Gitsevich et al. | |
| 6,791,426 B2 * | 9/2004 | Sato | 331/117 R |
| 6,806,785 B2 * | 10/2004 | Traub | 331/108 C |
| 7,034,623 B2 | 4/2006 | Khalil | |
| 7,061,339 B2 * | 6/2006 | Sibrai et al. | 331/117 R |
| 2002/0145481 A1 * | 10/2002 | Murgulescu | 331/117 R |
| 2004/0085144 A1 | 5/2004 | Wu et al. | |
| 2005/0212610 A1 * | 9/2005 | Brekelmans | 331/117 R |
| 2006/0181362 A1 * | 8/2006 | Ikuta et al. | 331/167 |

FOREIGN PATENT DOCUMENTS

| KR | 1020050034345 A | 4/2005 |
|---|---|---|
| KR | 1020060020002 A | 3/2006 |
| WO | 2004042913 A1 | 5/2004 |

* cited by examiner

*Primary Examiner*—Joseph Chang
*Assistant Examiner*—Jeffrey Shin
(74) *Attorney, Agent, or Firm*—Volentine & Whitt, P.L.L.C.

(57) ABSTRACT

A voltage controlled oscillator (VCO) includes a VCO unit having multiple VCO unit output terminals and an amplifier having multiple amplifier output terminals respectively connected to the VCO unit output terminals. The VCO unit generates first output signals having an oscillation frequency corresponding to a supply voltage. The amplifier amplifies a value obtained by performing n-th differentiation on a transconductance component of each first output signal (n being a natural number). Second output signals, corresponding to the first output signals, are output through the amplifier output terminals. Each second output signal includes the amplified value of the corresponding first output signal.

15 Claims, 6 Drawing Sheets

VOLTAGE CONTROLLED OSCILLATOR FOR CONTROLLING PHASE NOISE AND METHOD USING THE SAME

CROSS-REFERENCE TO RELATED PATENT APPLICATION

A claim of priority is made to Korean Patent Application No. 10-2007-0002174, filed on Jan. 8, 2007, the subject matter of which is hereby incorporated by reference.

BACKGROUND OF THE INVENTION

1. Field of the Invention

The present invention relates to phase noise control, and more particularly, to a Voltage Controlled Oscillator (VCO) for controlling phase noise and a method of controlling the phase noise by using the VCO.

2. Description of the Related Art

A Voltage Controlled Oscillator (VCO) is an apparatus for outputting a desired oscillation frequency using a supply voltage, and is widely used, for example, in mobile communication terminals and the like. For example, the VCO functions as a local oscillator, which may be used in a Phase Locked Loop (PLL) module of a mobile communication device to assign channels and to convert a frequency into a Radio Frequency (RF) or an Intermediate Frequency (IF).

Complementary metal-oxide-semiconductor (CMOS) VCOs, including LC resonators, are generally used as high-frequency VCOs. As many types of mobile communication applications have been recently developed, and as low-power system ICs having many integrated functions have become more prevalent, CMOS circuits have become widely used due to their low manufacturing costs, integratibility, and high reliability in the manufacturing process. However, since the CMOS circuits generally have poor noise characteristics, a low breakdown voltage, and a low gain, CMOS circuits present some difficulties notwithstanding their high integration and efficient productivity.

Accordingly, improving phase noise performance has been actively researched in order to maximize the VCO performance, while maintaining the advantages of CMOS circuits. An exemplary VCO is disclosed in U.S. Patent Application Publication No. 2004/0085144, which published on May 6, 2004.

FIG. 1 is a circuit diagram of a conventional VCO 100 using an LC resonator 150.

Referring to FIG. 1, the conventional VCO 100 includes differential amplifiers 110 and 170, and an LC resonator 150. The differential amplifier 110 is a latch circuit in which two PMOS transistors P110 and P115 are cross-coupled. That is, the gate of the PMOS transistor P110 is connected to a first terminal of the PMOS transistor P115, a first terminal of the PMOS transistor P110 is connected to the gate of the PMOS transistor P115, and a second terminal of the PMOS transistor P110 is connected to a supply voltage source VDD. Likewise, the gate of the PMOS transistor P115 is connected to the first terminal of the PMOS transistor P110, the first terminal of the PMOS transistor P115 is connected to the gate of the PMOS transistor P110, and the second terminal of the PMOS transistor P110 is connected to the supply voltage source VDD.

The differential amplifier 170 is also a latch circuit in which two NMOS transistors N170 and N175 are cross-coupled. The differential amplifier 170 has substantially the same construction as the differential amplifier 110, except using NMOS transistors N170 and N175 instead of PMOS transistors.

The LC resonator 150 is connected between the differential amplifiers 110 and 170. The LC resonator 150 determines a frequency by varying an inductance component or a capacitance component. The points at which the differential amplifiers 110 and 170 are connected to the LC resonator 150 are used as output terminals Vo+ and Vo− of the VCO 100.

As stated above, as many types of mobile communication applications have been developed, requiring low-power system ICs with many integrated functions, a VCO capable of improving phase noise performance is needed.

SUMMARY OF THE INVENTION

According to an aspect of the present invention, there is provided a voltage controlled oscillator (VCO) including a VCO unit having multiple VCO unit output terminals and an amplifier having multiple amplifier output terminals respectively connected to the VCO unit output terminals. The VCO unit generates first output signals having an oscillation frequency corresponding to a supply voltage. The amplifier amplifies a value obtained by performing n-th differentiation on a transconductance component of each first output signal (n being a natural number). Multiple second output signals, corresponding to the multiple first output signals, are output through the amplifier output terminals, each second output signal including the amplified value of the corresponding first output signal. The n-th differentiation performed on the transconductance component of each first output signal may be a secondary differentiation.

The amplifier may amplify the value obtained by performing the n-th differentiation on the transconductance component of each first output signal by adjusting a bias voltage applied to the amplifier. The bias voltage may be a voltage at which the first output signals intersect with each other, where the first output signals have predetermined slopes.

The amplifier may further include a first transistor having a gate connected to one end of a first resistor and one end of a first capacitor, a first terminal connected to a source of the supply voltage, and a second terminal connected to one end of a second capacitor and a first output terminal of the multiple VCO unit output terminals. Also, the amplifier may include a second transistor having a gate connected to one end of a second resistor and an opposite end of the second capacitor, a first terminal connected to the supply voltage source, and a second terminal connected to an opposite end of the first capacitor and a second output terminal of the multiple VCO unit output terminals. An opposite end of the first resistor and an opposite end of the second resistor may be connected to a bias voltage applied to the amplifier. The first and second transistors may be PMOS transistors.

The VCO unit may further include a first differential amplifier having a first terminal connected to a supply voltage source and a second differential amplifier having a first terminal connected to a ground voltage source. An LC resonator may be connected to a second terminal of the first differential amplifier and a second terminal of the second differential amplifier. Both ends of the LC resonator may be connected to the amplifier.

The LC resonator may include a first resonance circuit having two serially connected varactor diodes connected in parallel to an inductor. The LC resonator may further include a second resonance circuit connected to a first terminal of the first resonance circuit, the second resonance circuit having at least one inductor and at least one capacitor connected in parallel with each other. Also, the LC resonator may include a third resonance circuit connected to a second terminal of the first resonance circuit, the third resonance circuit having at least one inductor and at least one capacitor connected in parallel with each other.

Each of the first differential amplifier and the second differential amplifier may include a latch circuit, having two transistors which are cross-coupled. The transconductance component of each first output signal may be a sum of transconductance components of the transistors that are in a turned-on state in the first and second differential amplifiers.

According to another aspect of the present invention, there is provided a method of improving phase noise in a VCO. The method includes generating first output signals having an oscillation frequency corresponding to a supply voltage; amplifying a value obtained by performing n-th (n being a natural number) differentiation on a transconductance component of each first output signal; and outputting second output signals corresponding to the first output signals. Each second output signal includes the amplified value of the corresponding first output signal. The n-th differentiation may be a secondary differentiation.

Amplifying the value may include applying a bias voltage and amplifying the value obtained by performing n-th differentiation on the transconductance component of each first output signal by adjusting the bias voltage. The bias voltage may be a voltage at a point where the first output signals intersect with each other, the first output signals having predetermined slopes. The transconductance component may be a sum of transconductance components of transistors in a turned-on state of multiple transistors in the VCO.

According to yet another aspect of the present invention there is provided a method of reducing phase noise in a VCO. The method includes generating a first output signal having an oscillation frequency corresponding to a supply voltage; performing secondary differentiation on a transconductance component of the first output signal to obtain a differentiation value; amplifying the differentiation value; and outputting a second output signal corresponding to the first output signal. The second output signal includes the amplified differentiation value. Also, the second output signal may have a steeper slope than the first output signal, and may have a wave form approximating a square wave. Amplifying the differentiation value may include adjusting a bias voltage.

BRIEF DESCRIPTION OF THE DRAWINGS

The embodiments of the present invention will be described with reference to the attached drawings, in which.

DETAILED DESCRIPTION OF THE EMBODIMENTS

Figure 1:
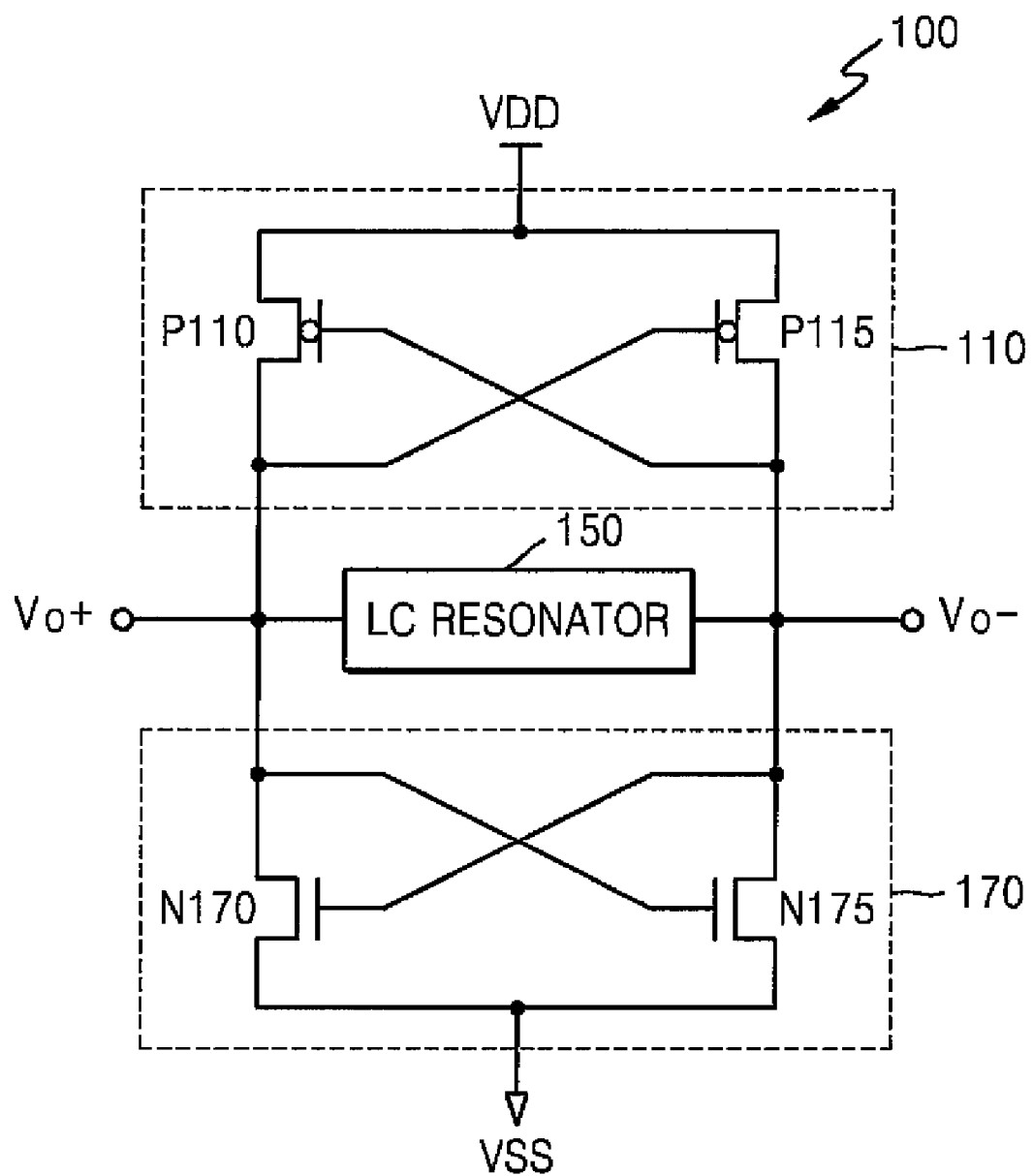
FIG. 1 is a circuit diagram of a conventional Voltage Controlled Oscillator (VCO) using an LC resonator.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Embodiments of the present invention provide a Voltage Controlled Oscillator (VCO) for controlling phase noise by outputting an output signal having a waveform similar to or approximating a square wave. Embodiments of the present invention also provide a method of controlling phase noise using the VCO.

Figure 2:
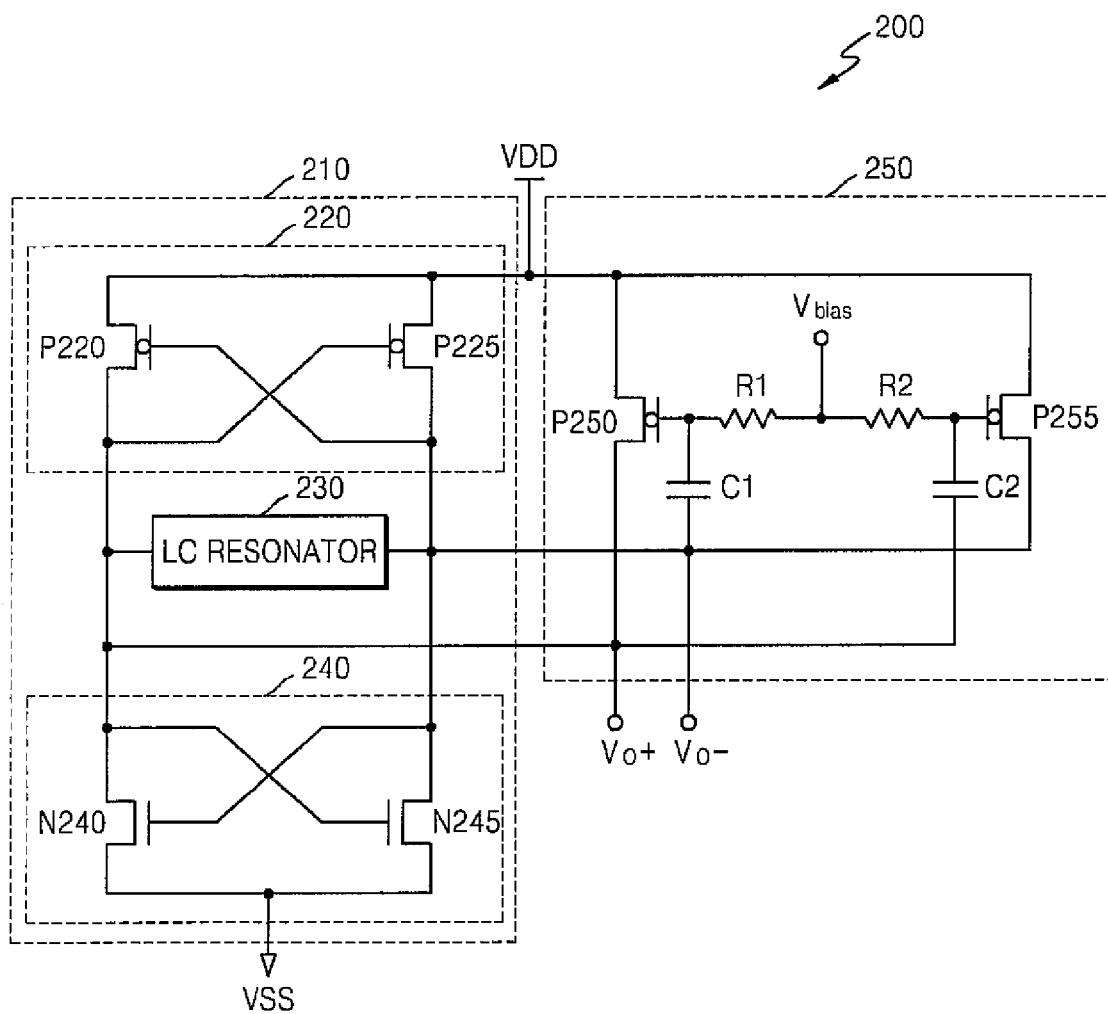
FIG. 2 is a circuit diagram of a VCO, according to an exemplary embodiment of the present invention.

FIG. 2 is a circuit diagram of a VCO 200 according to an exemplary embodiment of the present invention.

Referring to FIG. 2, the VCO 200 includes a VCO unit 210 and an amplifier unit 250. The VCO unit 210 includes a first differential amplifier 220, an LC resonator 230, and a second differential amplifier 240. The first differential amplifier 220 is a latch circuit in which two transistors P220 and P225 are cross-coupled. That is, the gate of the transistor P220 is connected to a first terminal of the transistor P225, a first terminal of the transistor P220 is connected to the gate of the transistor P225, and a second terminal of the transistor P220 is connected to a supply voltage VDD source. Likewise, the gate of the transistor P225 is connected to the first terminal of the transistor P220, the first terminal of the transistor P225 is connected to the gate of the transistor P220, and the second terminal of the transistor P225 is connected to the supply voltage VDD source. The transistors P220 and P225 may be PMOS transistors, for example.

The second differential amplifier 240 is also a latch circuit in which two transistors N240 and N245 are cross-coupled, and has substantially the same construction as the first differential amplifier 220, except that the transistors N240 and N245 are connected to a ground voltage VSS source instead of the supply voltage VDD source. The transistors N240 and N245 may be NMOS transistors, for example.

The LC resonator 230 is connected between the first differential amplifier 220 and the second differential amplifier 240. As is well known in the related art, the LC resonator 230 determines a frequency by varying an inductance component and/or a capacitance component. The LC resonator 230 will be described below with reference to FIGS. 3A and 3B.

The amplifier unit 250 may include multiple resistors, capacitors and transistors. The gate of a first transistor P250 among the multiple transistors is connected to a first resistor R1 and one end of a first capacitor C1. A first terminal of the first transistor P250 is connected to a supply voltage VDD source, and a second terminal of the first transistor P250 is connected to one end of a second capacitor C2. Also, the gate of a second transistor P255 is connected to one end of a second resistor R2 and the other end of the second capacitor C2. A first terminal of the second transistor P255 is connected to the supply voltage VDD source, and a second terminal of the second transistor P255 is connected to the other end of the first capacitor C1. The first transistor P250 and the second transistor P225 may be PMOS transistors. The other end of the first resistor R1, the other end of the second resistor R2, and a bias voltage $V_{bias}$ source are connected to the same node.

The VCO unit 210 and the amplifier unit 250 are connected to first and second output terminals Vo+ and Vo− of the VCO 200. That is, one end of the LC resonator 230 is connected to the first capacitor C1 and the second terminal of the second transistor P255 at a first node, which is used as the first output terminal Vo+ of the VCO 200. The other end of the LC resonator 230 is connected to the second capacitor C2 and the second terminal of the first transistor P250 at a second node, which is used as the second output terminal Vo− of the VCO 200. The operation of the VCO 200 will be described below with reference to FIG. 4.

Figure 3A:
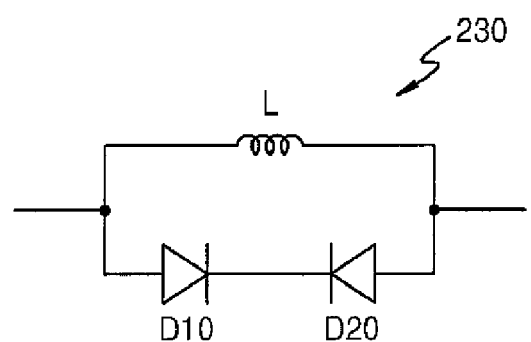
FIG. 3A is a circuit diagram of an LC resonator illustrated in FIG. 2, according to an exemplary embodiment of the present invention.

FIG. 3A is a circuit diagram of the LC resonator 230 illustrated in FIG. 2, according to an exemplary embodiment of the present invention.

Referring to FIG. 3A, the LC resonator 230 includes an inductor L and two varactor diodes D10 and D20. The varactor diodes D10 and D20 have capacitance(s) that vary according to an applied voltage. When a voltage applied to the varactor diodes D11 and D20 changes, an internal equivalent capacitance changes. Thus a resonance frequency of the LC resonator 230 changes, and accordingly an oscillation frequency of an output signal of the VCO 210 changes. Therefore, by controlling the applied voltage, it is possible to vary an oscillation frequency of an output signal of the VCO 210.

Figure 3B:
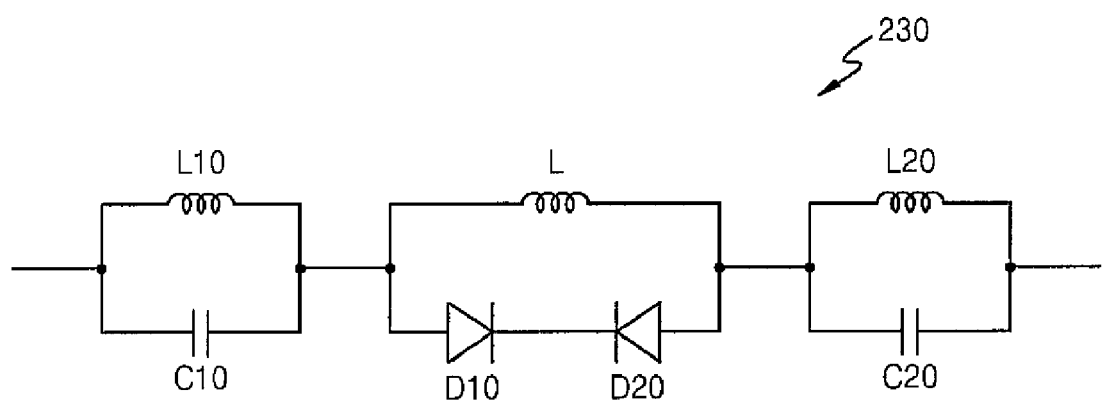
FIG. 3B is a circuit diagram of the LC resonator illustrated in FIG. 2, according to another exemplary embodiment of the present invention.

FIG. 3B is a circuit diagram of the LC resonator 230 illustrated in FIG. 2, according to another exemplary embodiment of the present invention.

Referring to FIG. 3B, the LC resonator 230 is a harmonic-tuned LC resonator. The LC resonator 230 includes a first resonance circuit, a second resonance circuit, and a third resonance circuit. The first resonance circuit has the same construction as that illustrated in FIG. 3A. The second resonance circuit includes at least one inductor L10 and at least one capacitor C10, which are connected in parallel with each other. The second resonance circuit is connected to a first terminal of the first resonance circuit. The third resonance circuit includes at least one inductor L20 and at least one capacitor C20, which are connected in parallel with each other. The third resonance circuit is connected to a second terminal of the first resonance circuit.

Figure 4:
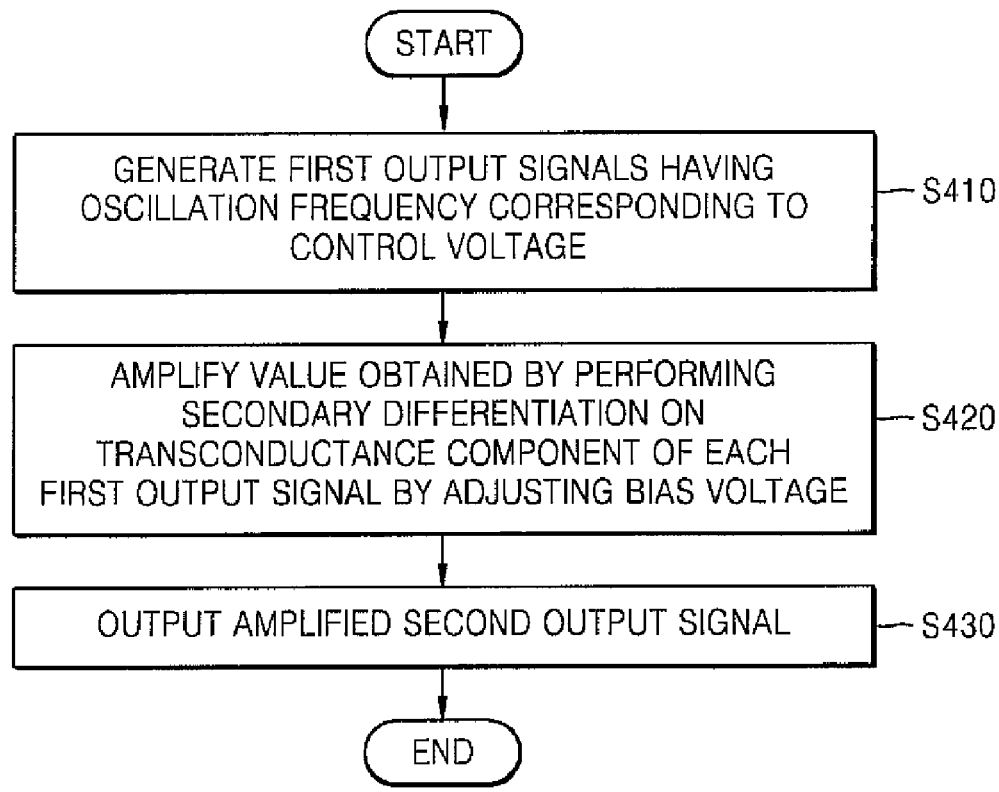
FIG. 4 is a flowchart of a phase noise control method of a VCO, according to an exemplary embodiment of the present invention.

FIG. 4 is a flowchart of a phase noise control method performed, for example, by the VCO 200 illustrated in FIG. 2, according to an exemplary embodiment of the present invention.

The phase noise control method will be described with reference to FIGS. 2 and 4. When a supply voltage VDD is applied, the VCO unit 210 generates multiple first output signals having an oscillation frequency corresponding to the supply voltage VDD (operation S410). The amplifier unit 250 amplifies a value that is obtained by performing secondary differentiation on a transconductance component of each first output signal (operation S420). For example, the amplifier unit 250 amplifies the value obtained by performing secondary differentiation on the transconductance component of each first output signal by adjusting the values of the bias voltage $V_{bias}$, the transistors P250 and 255, the resistors R1 and R2, and/or the capacitors C1 and C2. The bias voltage $V_{bias}$ may be a voltage at a point where the first output signals, which have predetermined slopes, intersect with each other. Because the first output signals measured respectively at both ends of the LC resonator 230 have opposite phases, the bias voltage $V_{bias}$ may be a voltage near a point at which a first output signal, having a positive slope, intersects another first output signal, having a negative slope.

In the case of a conventional VCO, phase noise is at a maximum near the point at which output signals with predetermined slopes intersect each other. Accordingly, in order to remove phase noise, the VCO 200 significantly increases the slope of an output signal at a point at which maximum phase noise appears and outputs an output waveform similar to or approximating a square wave. Thus, the VCO 200, according to the present embodiment, may adjustably set the bias voltage $V_{bias}$ as described below.

In an embodiment, the transconductance component of each first output signal is a sum of the transconductance components of the transistors which are in a tuned-on state, from among the transistors P220 and P225 of the first differential amplifier 220 and the transistors N240 and N245 of the second differential amplifier 240. For example, it may be assumed that the PMOS transistor P220 of the first differential amplifier 220 and the NMOS transistor N245 of the second differential amplifier 240 are turned on. In this case, the transconductance component of each first output signal is a sum of the transconductance component of the PMOS transistor P220 and the transconductance component of the NMOS transistor N245. The amplifier unit 250 then amplifies a value obtained by performing n-th differentiation on the transconductance component, where n is a natural number, such as "2" (e.g., as indicated by the "secondary differentiation" in step S420 of the exemplary embodiment depicted in FIG. 4).

A power series near an operating bias voltage when a Field Effect Transistor (FET), for example, operates in a saturation region can be expressed by Equation 1:

$$i_d(v_{gs}) = g_{m1} * v_{gs} + g_{m2} * v_{gs}^2 * g_{m2} * v_{gs}^3 + \dots, \qquad (1)$$

In Equation 1, $i_d$ denotes a current which flows between the drain and source of the FET, $v_{gs}$ denotes a voltage between the gate and source of the FET, $g_{m1}$ denotes the transconductance component of the FET, and $g_{m2}$ and $g_{m3}$ respectively denote secondary and tertiary nonlinear coefficients for an input signal. Since a value obtained by performing secondary differentiation, for example, on the transconductance component $g_{m1}$ is $g_{m3}$, the amplifier unit 250 would amplify the value $g_{m3}$ in this example.

Accordingly, since the amplifier 250 amplifies the value $g_{m3}$ obtained by performing secondary differentiation on the transconductance component, the VCO 200 increases an odd-numbered harmonic wave of each first output signal, and outputs a second output signal having a waveform similar to a square wave through one of the output terminals Vo+ and Vo− (operation S430). Because each second output signal output through one of the output terminals Vo+ and Vo− has a waveform similar to a square wave, the second output signal has a very high slope. Accordingly, as described above, it is possible to more effectively remove phase noise.

Figure 5:
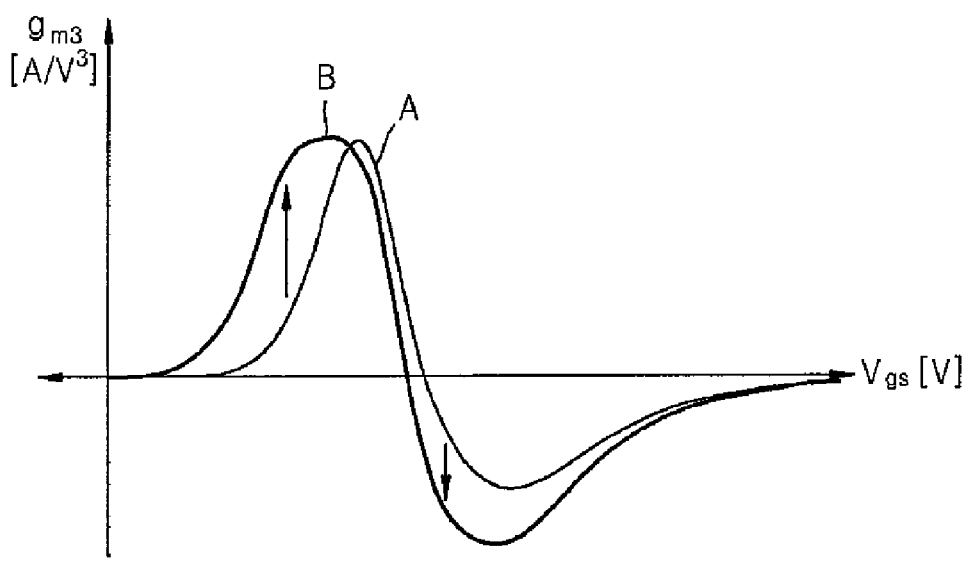
FIG. 5 is a graph showing a value, obtained by performing secondary differentiation on a transconductance component, amplified by an amplifier illustrated in FIG. 2, according to an exemplary embodiment of the present invention.

FIG. 5 is a graph showing the value $g_{m3}$, obtained by performing secondary differentiation on the transconductance component of a first output signal, amplified by the amplifier unit 250 illustrated in FIG. 2.

Referring to FIGS. 2 and 5, curve A corresponds to the case in which the amplifier unit 250 does not operate, and curve B corresponds to the case in which the amplifier unit 250 operates. By adjusting a bias voltage $V_{bias}$ through the amplifier unit 250, the value $g_{m3}$ obtained by performing secondary differentiation on the transconductance component of each first output signal is amplified, both in a positive region and in a negative region. As a result, second output signals of the VCO 200 appear as illustrated in FIG. 6B, discussed below.

Figure 6A:
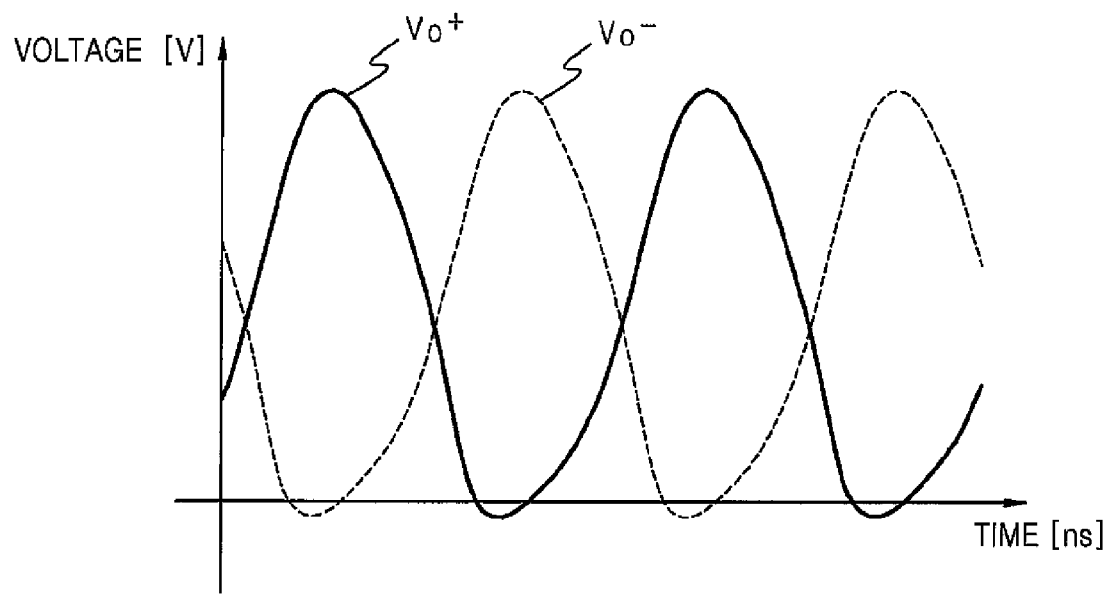
FIG. 6A is a graph showing output signal waveforms of a conventional VCO.
Figure 6B:
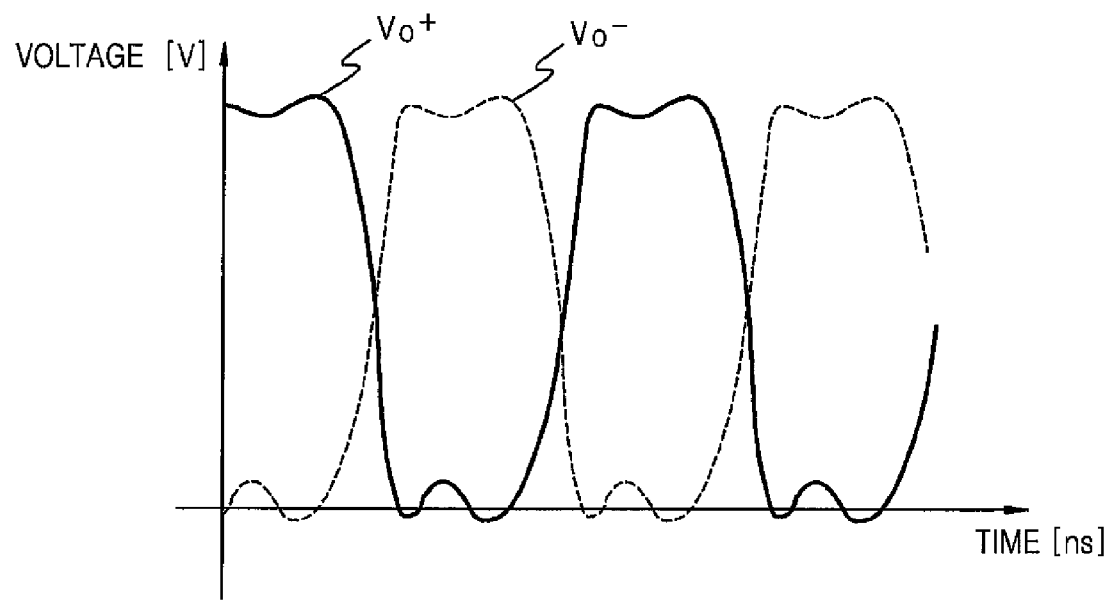
FIG. 6B is a graph showing output signal waveforms of a VCO, according to an exemplary embodiment of the present invention.

FIG. 6A is a graph showing output signal waveforms of a conventional VCO, and FIG. 6B is a graph showing output signal waveforms, for example, of the VCO 200 illustrated in FIG. 2, according to an exemplary embodiment of the present invention.

Referring to FIG. 6A, conventional output signals, which are output through output terminals Vo+ and Vo− of a conventional VCO, have waveforms similar to a sine wave. In contrast, referring to FIG. 6B, the second output signals, which are output through output terminals Vo+ and Vo− of the VCO 200 according to an exemplary embodiment of the present invention, have waveforms similar to a square wave. That is, according to the depicted embodiment, the slopes of the second output signals of the VCO 200 are significantly steeper (increased) as compared to the slopes of the output signals of the conventional technique. Therefore, the phase noise of the VCO output signals is efficiently reduced.

Figure 7:
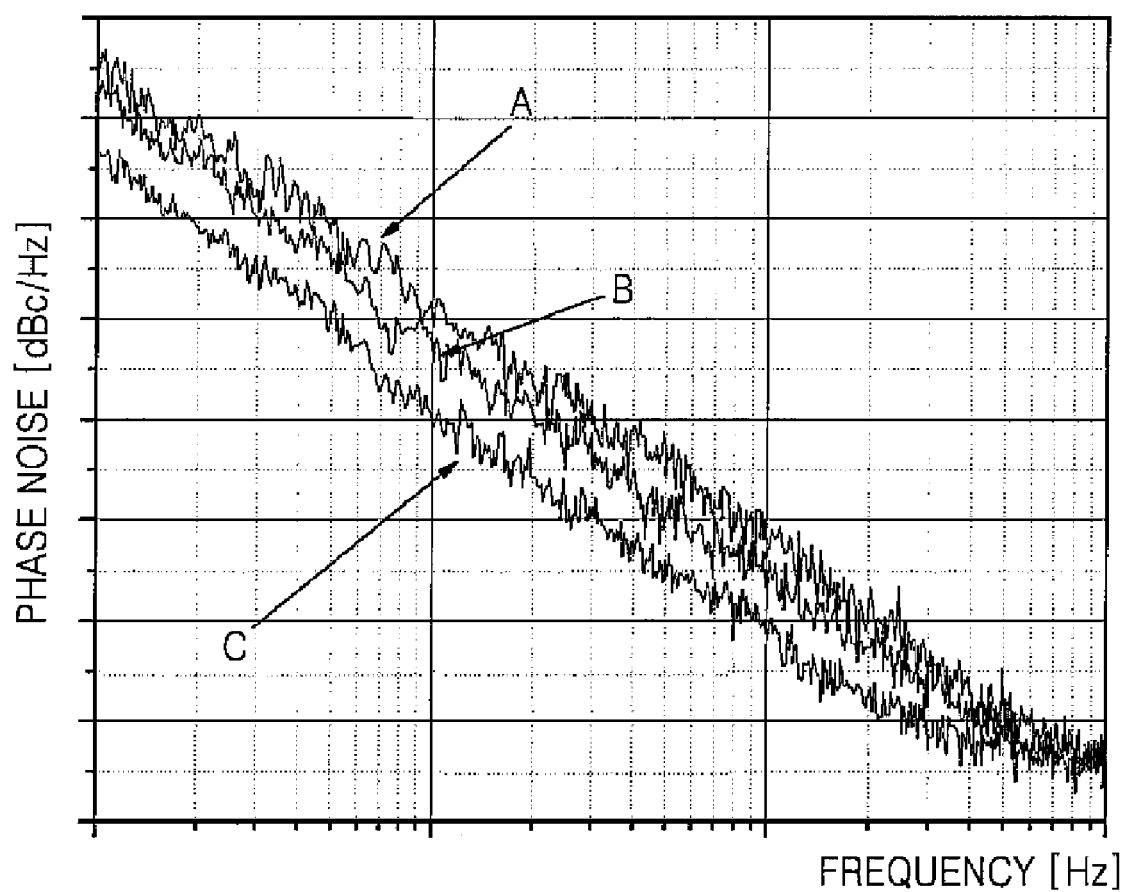
FIG. 7 is a graph of frequency versus phase noise for comparing the degree of phase noise of an exemplary embodiment of the present invention with the degree of phase noise of the conventional art.

FIG. 7 is a graph of frequency versus phase noise for comparing the degree of phase noise of an exemplary embodiment of the present invention with the degree of phase noise of the conventional art.

Referring to FIG. 7, graph A corresponds to the case in which the LC resonator 150 of the VCO 100 illustrated in FIG. 1 is constructed as illustrated in FIG. 3A. Graph B corresponds to the case in which the LC resonator 150 of the VCO 100 illustrated in FIG. 1 is constructed as illustrated in FIG. 3B. Graph C is a graph showing phase noise of the VCO 200 according to an exemplary embodiment of the present invention illustrated in FIG. 2. In comparison, graph B shows improved phase noise over graph A. However, graph C according to an exemplary embodiment of the present invention shows significantly more improvement with respect to phase noise than the graphs A and B according to the conventional art.

As described above, according to embodiments of the present invention, by outputting output signals having waveforms similar to a square wave, it is possible to efficiently reduce the phase noise of the output signals of a VCO. That is, because the VCO output signals have very high or steep slopes, as compared to the conventional art, the phase noise of these output signals is improved.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A voltage controlled oscillator (VCO) comprising:
    a VCO unit comprising a plurality of VCO unit output terminals, the VCO unit generating a plurality of first output signals having an oscillation frequency corresponding to a supply voltage; and
    an amplifier comprising a plurality of amplifier output terminals respectively connected to the plurality of VCO unit output terminals, the amplifier amplifying a value obtained by performing n-th differentiation on a transconductance component of each first output signal (n being a natural number) by adjusting a bias voltage applied to the amplifier,
    wherein a plurality of second output signals, corresponding to the plurality of first output signals, are output through the plurality of amplifier output terminals, each second output signal comprising the amplified value of the corresponding first output signal, and
    wherein the bias voltage comprises a voltage at which the plurality of first output signals intersect with each other, the plurality of first output signals having first predetermined slopes.

2. The VCO of claim 1, wherein the n-th differentiation performed on the transconductance component of each first output signal comprises a secondary differentiation.

3. The VCO of claim 1, wherein the amplifier further comprises:
    a first transistor having a gate connected to one end of a first resistor and one end of a first capacitor, a first terminal connected to a source of the supply voltage, and a second terminal connected to one end of a second capacitor and a first output terminal of the plurality of VCO unit output terminals; and
    a second transistor having a gate connected to one end of a second resistor and an opposite end of the second capacitor, a first terminal connected to the supply voltage source, and a second terminal connected to an opposite end of the first capacitor and a second output terminal of the plurality of VCO unit output terminals,
    wherein an opposite end of the first resistor and an opposite end of the second resistor are connected to a bias voltage applied to the amplifier.

4. The VCO of claim 3, wherein the first transistor and the second transistor are PMOS transistors.

5. The VCO of claim 1, wherein the VCO unit further comprises:
    a first differential amplifier having a first terminal connected to a supply voltage source;
    a second differential amplifier having a first terminal connected to a ground voltage source; and
    an LC resonator connected to a second terminal of the first differential amplifier and a second terminal of the second differential amplifier,
    wherein both ends of the LC resonator are connected to the amplifier.

6. The VCO of claim 5, wherein the LC resonator comprises:
    a first resonance circuit comprising two serially connected varactor diodes connected in parallel to an inductor.

7. The VCO of claim 6, wherein the LC resonator further comprises:
    a second resonance circuit connected to a first terminal of the first resonance circuit, the second resonance circuit comprising at least one inductor and at least one capacitor connected in parallel with each other; and
    a third resonance circuit connected to a second terminal of the first resonance circuit, the third resonance circuit comprising at least one inductor and at least one capacitor connected in parallel with each other.

8. The VCO of claim 5, wherein each of the first differential amplifier and the second differential amplifier comprises a latch circuit, including two transistors which are cross-coupled.

9. The VCO of claim 8, wherein the transconductance component of each first output signal comprises a sum of transconductance components of the transistors that are in a turned-on state in the first differential amplifier and the second differential amplifier.

10. A method of improving phase noise in a voltage controlled oscillator (VCO), comprising:
    generating a plurality of first output signals having an oscillation frequency corresponding to a supply voltage;

amplifying a value obtained by performing n-th (n being a natural number) differentiation on a transconductance component of each first output signal, wherein amplifying the value comprises applying and adjusting a bias voltage; and outputting a plurality of second output signals corresponding to the plurality of first output signals, each second output signal comprising the amplified value of the corresponding first output signal, wherein the bias voltage comprises a voltage at a point where the plurality of first output signals intersect with each other, the plurality of first output signals having predetermined slopes.

11. The method of claim 10, wherein performing the n-th differentiation comprises performing a secondary differentiation on the transconductance component of each first output signal.

12. The method of claim 10, wherein the transconductance component comprises a sum of transconductance components of transistors in a turned-on state of a plurality of transistors in the VCO which generate the plurality of first output signals.

13. A method of reducing phase noise in a voltage controlled oscillator (VCO), the method comprising:

generating a first output signal having an oscillation frequency corresponding to a supply voltage;

performing secondary differentiation on a transconductance component of the first output signal to obtain a differentiation value;

amplifying the differentiation value; and outputting a second output signal corresponding to the first output signal, second output signal comprising the amplified differentiation value, wherein amplifying the differentiation value comprises adjusting an applied bias voltage, the bias voltage comprising a voltage at a point where the first output signal intersects another first output signal, the first output signals having predetermined slopes.

14. The method of claim 13, wherein the second output signal has a steeper slope than the first output signal.

15. The method of claim 14, wherein the second output signal comprises a wave form approximating a square wave.

* * * * *